United States Patent
You (10) Patent No.: US 11,031,091 B2
(45) Date of Patent: Jun. 8, 2021

(54) APPARATUS AND METHOD FOR MEASURING ROUND-TRIP TIME OF TEST SIGNAL USING PROGRAMMABLE LOGIC

(71) Applicant: UNITEST INC., Yongin-si (KR)

(72) Inventor: Ho Sang You, Seoul (KR)

(73) Assignee: UNITEST INC., Yongin-si (KR)

(*) Notice: Subject to any disclaimer, the term of this patent is extended or adjusted under 35 U.S.C. 154(b) by 316 days.

(21) Appl. No.: 15/976,907

(22) Filed: May 11, 2018

(65) Prior Publication Data
US 2018/0261304 A1    Sep. 13, 2018

Related U.S. Application Data (63) Continuation-in-part of application No. 14/446,438, filed on Jul. 30, 2014, now abandoned.

(30) Foreign Application Priority Data

Jul. 31, 2013 (KR) .................. 10-2013-0090907

(51) Int. Cl.
    G11C 29/56    (2006.01)
    H03K 19/177   (2020.01)
(52) U.S. Cl.
    CPC .. G11C 29/56012 (2013.01); G11C 29/56004 (2013.01); H03K 19/177 (2013.01)
(58) Field of Classification Search
    CPC ........ G11C 29/56012; G11C 29/56004; H03K 19/177
    See application file for complete search history.

(56) References Cited

U.S. PATENT DOCUMENTS 4,870,302 A * 9/1989 Freeman ............ H03K 19/1736
                                              326/41
6,348,811 B1 * 2/2002 Haycock ................ H04L 1/243
                                              326/16
(Continued)

FOREIGN PATENT DOCUMENTS

KR  10-2009-0127689 A   12/2009
KR  10-2010-0032287 A    3/2010
KR  10-2011-0126503 A   11/2011

OTHER PUBLICATIONS

M. Haraguchi and et al, "A Continuous-Adaptive DDR2 Interface with Flexible Round-Trip-Time and Full Self Loop—NMOS output driver impedance is adjusted precisely in a very Backed AC Test", ISSCC 2007 / Session 27 / DRAM and eRAM / 27.3, IEEE International Solid-State Circuits Conference (Year: 2007).*

(Continued)

Primary Examiner — Alexander Satanovsky
Assistant Examiner — Douglas Kay
(74) Attorney, Agent, or Firm — Rabin & Berdo, P.C.

(57) ABSTRACT

An apparatus for measuring round-trip time of a test signal using a programmable logic device comprises a pattern generator generating a test signal and measuring a round-trip time of the test signal, a programmable logic device of which internal circuits are configured to transmit the test signal in a predetermined manner, and bidirectional bus lines connecting the pattern generator and the programmable logic device. The round-trip time of the test signal is measured by a time difference between a starting time at which the pattern generator outputs the test signal and an arrival time at which the test signal is fed back to the pattern generator.

6 Claims, 4 Drawing Sheets (56) References Cited

U.S. PATENT DOCUMENTS

| 8,352,242 B2 | 1/2013 | Schmitt |
| 2003/0076125 A1 | 4/2003 | McCord |
| 2011/0276302 A1* | 11/2011 | Rivoir ............. G01R 31/31903 702/117 |
| 2013/0343207 A1 | 12/2013 | Cook |
| 2014/0336974 A1* | 11/2014 | Jochen ............. G01R 31/31908 702/117 |

OTHER PUBLICATIONS

B. Provost and et al, "AC IO Loopback Design for High Speed uProcessor IO Test" International Test Conference, Paper 2.1 p. 23-30, 2004 (Year: 2004).*

M. Tripp and et al, "Elimination of Traditional Functional Testing of Interface Timings a1 Intel", International Test Conference, p. 1448-1456, 2004 (Year: 2004).*

* cited by examiner

ND METHOD FOR
APPARATUS AND METHOD FOR MEASURING ROUND-TRIP TIME OF TEST SIGNAL USING PROGRAMMABLE LOGIC

CROSS-REFERENCE RELATED APPLICATIONS

This application is a continuation-in-part application of co-pending U.S. application Ser. No. 14/446,438, filed Jul. 30, 2014, the disclosure of which is incorporated herein by reference. This application claims priority benefits under 35 U.S.C. § 1.119 to Korean Patent Application No. 10-2013-0090907 filed Jul. 31, 2013.

BACKGROUND OF THE INVENTION

1. Field of the Invention

The present invention relates to an apparatus for measuring a round-trip time of a test signal for a semiconductor memory test, and more particularly to an apparatus which can measure or calculate a round-trip time of a test signal even when a memory device is not under test.

2. Description of the Related Art

Regarding semiconductor test apparatus or devices, a plurality patents including Korean Patent Application Publication No. 10-2009-0127689 (hereinafter, referred to as "cited reference") has been published.

In the cited reference, the memory test device includes a general register for operating general commands; an extension register having a greater capacity than that of the general register and for operating extension commands; and a controller for writing a predetermined test pattern to an external memory using the extension commands, reading the test pattern written to the memory, determining whether the written test pattern and the read test pattern are matched with each other, and determining whether the memory is faulty or not.

In conventional semiconductor test devices including the cited reference, the DUTs are electrically coupled to a pattern generator for testing.

Particularly, upon semiconductor memory testing, a plurality of memory devices, i.e., DUTs, are dependently connected to a single output of the pattern generator to increase the productivity of the test. In this way, however, the capacitance in the load terminals may increase, making it impossible to execute fast testing.

Figure 1A:
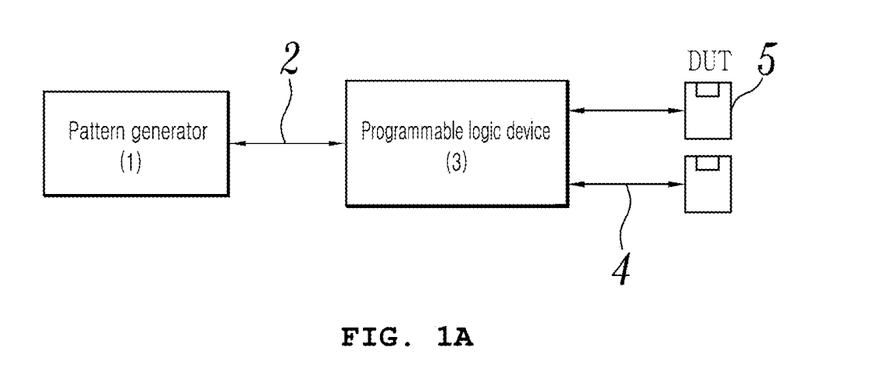
FIGS. 1A, 1B and 1C illustrate a conventional memory test device using a programmable logic device.
Figure 1B:
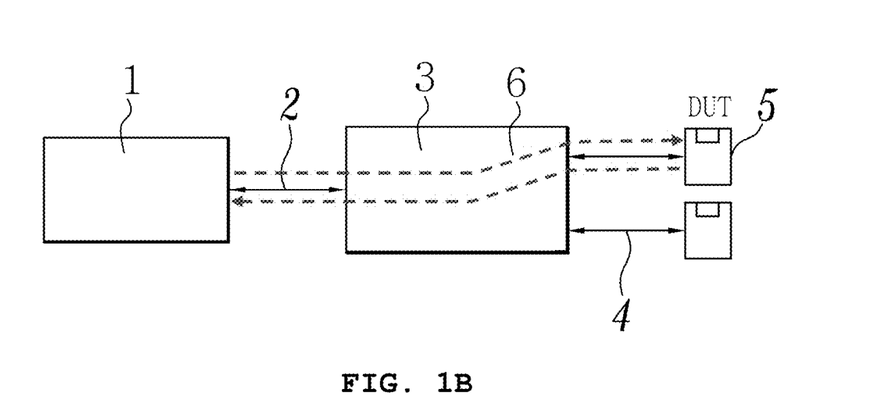
Figure 1C:
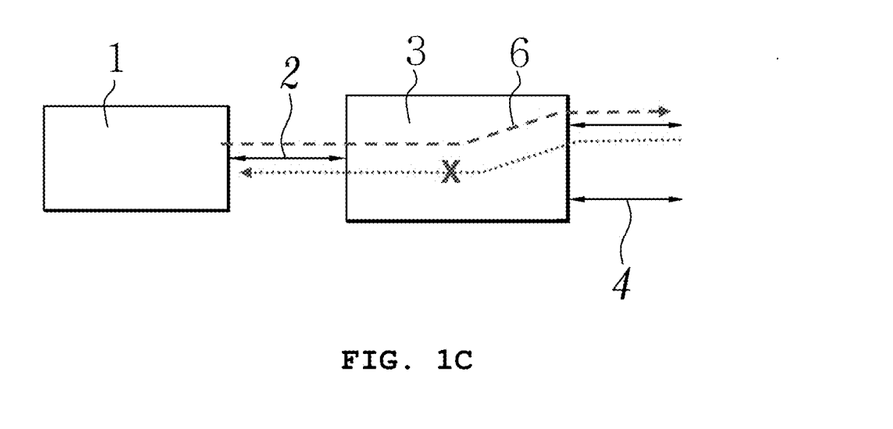

Thus, another conventional device utilizes a programmable logic device, as illustrated in FIGS. 1A, 1B and 1C, to reduce the fan-out, thereby resolving simultaneous measurement position and speed issues.

FIG. 1A illustrates the conventional memory test device using the programmable logic device. As illustrated in FIG. 1B, test data 6 outputted from the pattern generator 1 is sent to a programmable logic device 3 through a bidirectional bus 2, and continuously to final DUTs 5 through bidirectional buses 4 which are connected between the programmable logic device 3 and the DUTs 5.

Inversely, when the DUTs 5 send the test data as a response to the memory test device 3, the test data flow in the reverse sequence of the writing sequence and reach the pattern generator 1.

However, when the DUTs 5 are not connected in the bidirectional buses 4, there is no element to send back the test data to the pattern generator 1, and thus the programmable logic device 3 cannot receive any feedback data, as illustrated in FIG. 1C.

Also, when the DUTs 5 are not connected in the bidirectional buses 4, there is no closed loop circuit between the DUTs 5 and the programmable logic device 1 and the bidirectional buses 2 and 4 cannot transfer the test signal both direction simultaneously, thus without additional devices or bus lines, the pattern generator 1 cannot receive its feedback signal. That means, there is no way to measure a data round-trip time between the pattern generator 1 and the DUTs 5.

In addition, even if the round-trip time is obtained using the additional devices or bus lines, in case that the circuitry of the programmable logic device is modified in total or in part, the previously measured round-trip time cannot be used in the modified device.

Meanwhile, in the memory test, particular in the large scale memory test, it is very critical to know the round-trip time (or, the round-trip delay) for setting appropriate parameters. For example, the round-trip time can be used for a temporal correction to the pattern generator, thereby achieving accurate testing. For another example, the round-trip time can be used to obtain skew differences between data buffers. For, another example, the round-trip delay should be known for an accurate comparison with the test pattern and the data read from the DUT. In other words, to compare the test pattern and the data on an exact timing, the time at which the data from the DUT is fed back with the round-trip delay after a read command is applied in the device should be known.

SUMMARY OF THE INVENTION

Accordingly, the present invention has been made keeping in mind the above problems occurring in the prior art, and an object of the present invention is to provide an apparatus for measuring a round-trip time of a test signal from a pattern generator to a DUT without the additional use of devices or physical bus lines even in case of the absence of the DUT.

In order to accomplish the above object, an embodiment of the present invention provides an apparatus for measuring round-trip time of a test signal using a programmable logic device, comprising: a pattern generator generating a test signal and measuring a round-trip time of the test signal; first and second output buffers, each of which an input terminal is connected to the pattern generator; first and second input buffers, each of which an output terminal is connected to the pattern generator; a programmable logic device of which internal circuits are configured to transmit the test signal in a predetermined manner; third, fourth, fifth and sixth output buffers, each of which an input terminal is connected to the programmable logic device; third, fourth, fifth and sixth input buffers, each of which an output terminal is connected to the programmable logic device; a first line, of a bidirectional bus, connecting an output terminal of the first output buffer and an input terminal of the first input buffer with an output terminal of the third output buffer and an input terminal of the third input buffer; a second line, of the bidirectional bus, connecting an output terminal of the second output buffer and an input terminal of the second input buffer with an output terminal of the fourth output buffer and an input terminal of the fourth input buffer; a fifth connection line connecting an output terminal of the fifth output buffer and an input terminal of the fifth input buffer;

a sixth connection line connecting an output terminal of the sixth output buffer and an input terminal of the sixth input buffer.

Wherein the programmable logic device connects the output terminal of the third input buffer to the input terminal of the fifth output buffer, and the output terminal of the fifth input buffer to the input terminal of the fourth output buffer.

Wherein a round-trip time of the test signal is measured by a time difference between a starting time at which the pattern generator outputs the test signal and an arrival time at which the test signal is fed back to the pattern generator after traveling through the first output buffer, the first line of the bidirectional bus, the third input buffer, the programmable logic device, the fifth output buffer, the fifth connection line, the fifth input buffer, the programmable logic device, the fourth output buffer, the second line of the bidirectional bus and the second input buffer, in order.

In another embodiment of the present invention, a device under test (DUT) is configured to be connected to at least one of the fifth and sixth connection lines.

In another embodiment of the present invention, the DUT includes a plurality of memory devices to be tested.

In another embodiment of the present invention, the programmable logic device includes a demultiplexer configured to connect the output terminal of the fifth input buffer to the input terminal of the fourth output buffer or the input terminal of the third output buffer.

In another embodiment of the present invention, the programmable logic device further includes another demultiplexer configured to connect the output terminal of the sixth input buffer to the input terminal of the fourth output buffer or the input terminal of the third output buffer.

Another embodiment of the present invention provides a method for measuring round-trip time of a test signal using an apparatus, comprising: outputting, by the pattern generator, the test signal at a starting time; checking, by the pattern generator, an arrival time at which the test signal is fed back to the pattern generator after traveling through the first output buffer, the first line of the bidirectional bus, the third input buffer, the programmable logic device, the fifth output buffer, the fifth connection line, the fifth input buffer, the programmable logic device, the fourth output buffer, the second line of the bidirectional bus and the second input buffer, in order; and measuring a round-trip time of the test signal using a time difference between the starting time and the arrival time; wherein the an apparatus includes: a pattern generator generating a test signal and measuring a round-trip time of the test signal; first and second output buffers, each of which an input terminal is connected to the pattern generator; first and second input buffers, each of which an output terminal is connected to the pattern generator; a programmable logic device of which internal circuits are configured to transmit the test signal in a predetermined manner; third, fourth and fifth output buffers, each of which an input terminal is connected to the programmable logic device; third, fourth and fifth input buffers, each of which an output terminal is connected to the programmable logic device; a first line, of a bidirectional bus, connecting an output terminal of the first output buffer and an input terminal of the first input buffer with an output terminal of the third output buffer and an input terminal of the third input buffer; a second line, of the bidirectional bus, connecting an output terminal of the second output buffer and an input terminal of the second input buffer with an output terminal of the fourth output buffer and an input terminal of the fourth input buffer; and a connection line connecting an output terminal of the fifth output buffer and an input terminal of the fifth input buffer; wherein the programmable logic device connects the output terminal of the third input buffer to the input terminal of the fifth output buffer, and the output terminal of the fifth input buffer to the input terminal of the fourth output buffer.

According to embodiments of the present invention, even when a DUT, e.g., a memory device, is absent in the test circuit, the round-trip time of a test signal can be effectively measured without any additional physical bus line.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description of the present invention will be given with reference to the drawings. In the following description, it is noted that, when the detailed description of known techniques related with the present invention may make the gist of the present invention unclear, a detailed description thereof will be omitted.

Figure 2:
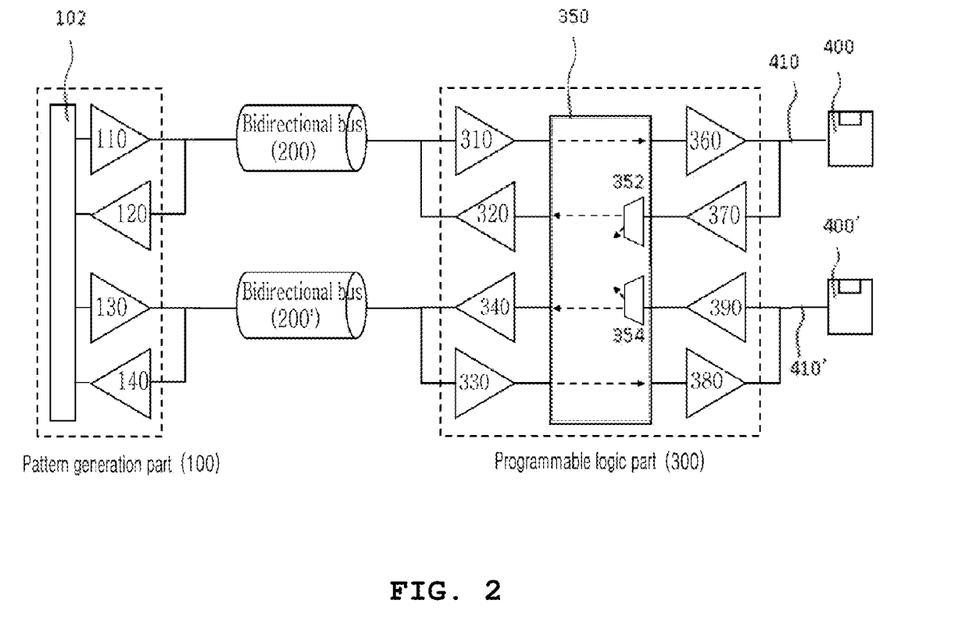
FIG. 2 illustrates an apparatus for measuring the round-trip time of a test signal using a programmable logic device in an ordinary testing mode when a DUT is connected, according to the present invention.
Figure 3:
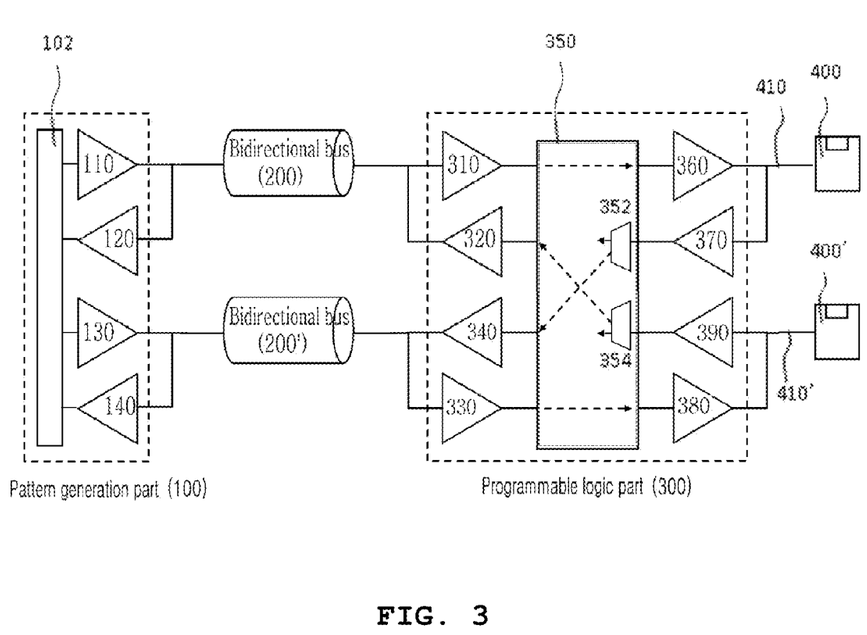
FIG. 3 illustrates an apparatus for measuring the round-trip time of a test signal using a programmable logic device when a DUT is absent, according to the present invention.

As illustrated in FIGS. 2 and 3, the apparatus for measuring the round-trip time of the test signal (or test data, or pattern signal, or test signal) comprises a pattern generation part 100, a programmable logic part 300, and bidirectional bus lines 200 and 200' connected between the pattern generation part 100 and the programmable logic part 300.

The pattern generation part 100 includes a pattern generator 102 which generates a test signal (or test data, or pattern signal, or test signal) for testing the DUTs, and measures the round-trip time. Also, the pattern generation part 100 may further include a calculation means (not shown) for calculating, for example, the round-trip time. The calculation means can be included in the pattern generator 102, or separated from the pattern generator 102.

The pattern generation part 100 may further include multiple out buffers 110 and 130 and multiple input buffers 120 and 140. Here, the output buffers 110 and 130 may be buffers, switches or pins which can transfer the test signal in one direction from an input terminal to an output terminal thereof. In other words, the output buffers 110 and 130 transfer the test signal from the pattern generator 102 to the outside thereof. Also, the input buffers 120 and 130 may be buffers, switches or pins which transfer the test signal in one direction from an input terminal to an output terminal thereof. In other words, the input buffers 120 and 140 transfer the test signal from the outside to the pattern generator 102. Also, the output buffers 110 and 130 and the input buffers 120 and 140, respectively, can be paired with each other to form an input-output pair.

The programmable logic part 300 includes a programmable logic device 350 of which internal circuits is configured to transmit the test signal in a predetermined manner. Also, the programmable logic device 350 may include at least one or multiple demultiplexers 352 and 354 which route data or signal from an input terminal to one of multiple output terminals thereof.

The programmable logic part 300 may further include multiple out buffers 320, 340, 360 and 380 and multiple input buffers 310, 330, 370 and 390. Here, the output buffers 320, 340, 360 and 380 may be buffers, switches or pins which transfer the test signal in one direction from an input terminal to an output terminal thereof. In other words, the out buffers 320, 340, 360 and 380 transfer the test signal from the programmable logic device 350 to the outside thereof. Also, the input buffers 310, 330, 370 and 390 may be buffers, switches or pins which transfer the test signal in one direction from an input terminal to an output terminal thereof. In other words, the input buffers 310, 330, 370 and 390 transfer the test signal from the outside to the programmable logic device 350. Also, the output buffers 320, 340, 360 and 380 and the input buffers 310, 330, 370 and 390, respectively, can be paired with each other to form an input-output pair.

The bidirectional bus lines 200 and 200' respectively connect the pattern generation part 100 and the programmable logic part 300. For example, an output terminal of the output buffer 110 and an input terminal of the input buffer 120 of the pattern generation part 100 can be connected to an input terminal of the input buffer 310 and an output terminal of the output buffer 320 of the programmable logic part 300 through the bidirectional bus line 200. Here, the bus line 200 may be a common line which can be used for reading and writing commonly, and may include multiple lines which can be used for reading and writing separately. Also, an output terminal of the output buffer 130 and an input terminal of the input buffer 140 of the pattern generation part 100 can be connected to an input terminal of the input buffer 330 and an output terminal of the output buffer 340 of the programmable logic part 300 through the bidirectional bus line 200'.

The DUTs 400 and 400' may be connected to the programmable logic part 300 for testing. For example, the DUT 400 may be connected to an output terminal of the output buffer 360 and an input terminal of the input buffer 370 of the programmable logic part 300, commonly or separately, through a connection line 410. Also, the DUT 400' may be connected to an output terminal of the output buffer 380 and an input terminal of the input buffer 390 of the programmable logic part 300, commonly or separately, through a connection line 410'.

Hereinafter, the process for measuring the round-trip time when the DUTs are connected in the apparatus, i.e., in ordinary testing mode, will be described with reference to FIG. 2.

The pattern generator 102 of the pattern generation part 100 outputs the test signal through the output buffer 110, and the bidirectional bus line 200 relays the test signal to the programmable logic part 300. Then, the input buffer 310 of the programmable logic part 300 receives the test signal and transfers it to the programmable logic device 350, and the programmable logic device 350 transmits the test signal to the output buffer 360, and the then test signal is transferred to the DUT 400 through the connection line 410.

Subsequently, once the DUT 400 receives the test signal, it feeds the test signal back to the pattern generation part 100. That is, the DUT 400 sends the test signal back to the input buffer 370 through the connection line 410, and the input buffer 370 transfers the test signal to the demultiplexer 352 of the programmable logic device 350. Then, the demultiplexer 352 routes the test signal to the output buffer 320, and continuously the test signal is transferred to the input buffer 120 of the pattern generation part 100 through the bidirectional bus line 200. Finally, the test signal is fed back to the pattern generator 102, and the pattern generator 102 measures the round-trip time using the test signal fed back.

Meanwhile, when the test signal is outputted from the pattern generator 102 through the output buffer 130, the round-trip time can be measured using the test signal which travels through the bidirectional bus line 200', the input buffer 330, the programmable logic device 350, the output buffer 380, the DUT 400', the input buffer 390, the demultiplexer 354, the output buffer 340, the bidirectional bus line 200' and the input buffer 140.

In this embodiment, the round-trip time of the test signal can be measured by the following method.

First, the pattern generator 102 outputs the test signal at a starting time, wherein the starting time may be stored in a memory and the like. And then the DUT 400 receives the test signal and feeds the test signal to the pattern generator 102.

Next, the pattern generator 102 receives the test signal from the DUT 400 and checks an arrival time at which the test signal arrives at the pattern generator. And then, the pattern generator measures a round-trip time of the test signal using a time difference between the starting time and the arrival time.

Meanwhile, if no DUT is connected in the apparatus, i.e., in the connection lines 410 and 410', the test signal cannot be returned of itself to the pattern generation part 100, as the reason described in the conventional device. Also, even when the output terminal of the output buffer 360 and the input terminal of the input buffer 370 are commonly connected by the connection line 410, since both feedforward and feedback test signals cannot pass simultaneously the bidirectional bus line 200, the test signal which starts from the pattern generator 102 cannot return to the pattern generator 102 of itself. Thus, a specific testing mode is required to measure round-trip-time when no DUT is connected in the apparatus.

Hereinafter, the apparatus and method for measuring the round-trip time, when no DUT is connected in the apparatus, with reference to FIGS. 3 and 4 according to the present invention.

The pattern generator 102 of the pattern generation part 100 outputs the test signal through the output buffer 110, and the bidirectional bus line 200 relays the output test signal to the programmable logic part 300. Then, the input buffer 310 of the programmable logic part 300 receives the test signal and transfers to the programmable logic device 350, and the programmable logic device 350 transmits the test signal to the output buffer 360, and the test signal is transferred to the connection line 410.

However, in this case the DUT 400 is not connected in the connection line 410, the test signal is immediately fed back to the input terminal of the input buffer 370 by the connection line 410 commonly connected therewith, and the input buffer 370 transfers the test signal to the programmable logic device 350.

Then, the demultiplexer 352 of the programmable logic device 350 routes the test signal to the output buffer 340 but not to the output buffer 320, and continuously the test signal is transferred to the input buffer 140 of the pattern generation part 100 through the output buffer 340 of the programmable logic part 300 and the bidirectional bus line 200'. Finally, the test signal is fed back to the pattern generator 102, and the pattern generator 102 measures the round-trip time using the test signal even without a DUT.

Figure 4:
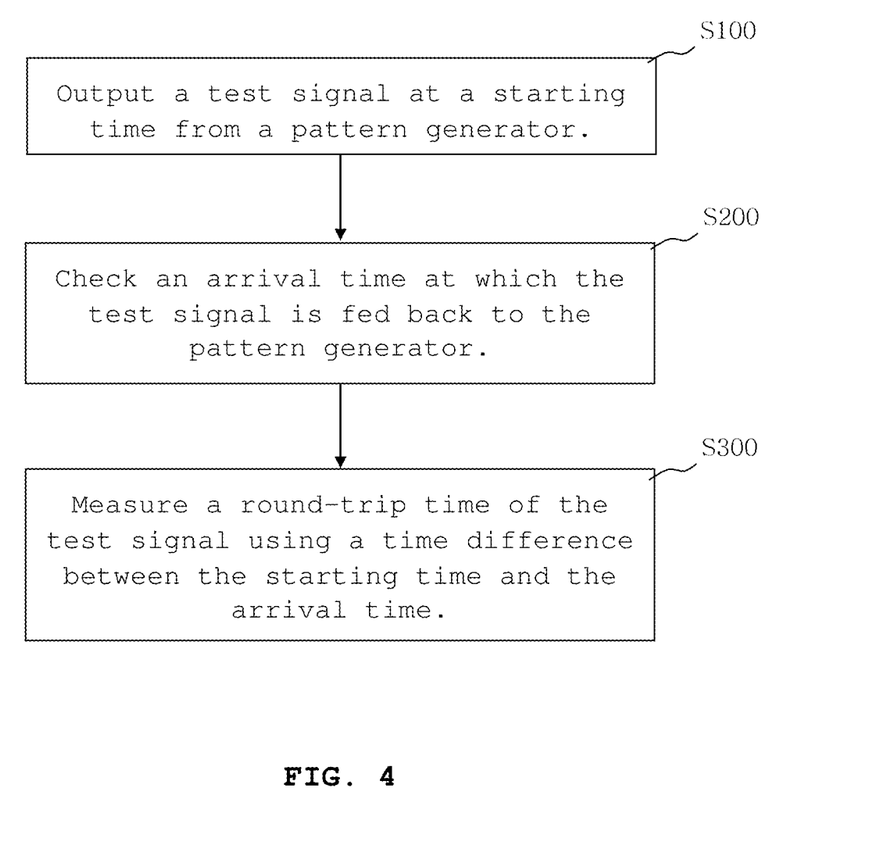
FIG. 4 illustrates a method for measuring the round-trip time of a test signal, according to the present invention.

In this embodiment, the round-trip time of the test signal can be measured by the method as described in FIG. 4.

First, the pattern generator 102 outputs the test signal at a starting time (S100). And then, the pattern generator 102 checks an arrival time at which the test signal is fed back to the pattern generator 102 after traveling through the first output buffer 110, the first line of the bidirectional bus 200, the third input buffer 310, the programmable logic device 350, the fifth output buffer 360, the fifth connection line 410, the fifth input buffer 370, the programmable logic device 350, the fourth output buffer 340, the second line of the bidirectional bus 200' and the second input buffer 140, in order (S200).

Next, the pattern generator 102 measures the round-trip time of the test signal using a time difference between the starting time and the arrival time (S300).

The round-trip time of the test signal also can be measured by another embodiment.

That is, the pattern generator 102 of the pattern generation part 100 outputs the test signal through the output buffer 130, and the bidirectional bus line 200' relays the output test signal to the programmable logic part 300. Then, the input buffer 330 of the programmable logic part 300 receives the test signal and transfers to the programmable logic device 350, and the programmable logic device 350 transmits the test signal to the output buffer 380, and the test signal is transferred to the connection line 410'.

Likewise, the DUT 400' is not connected in the connection line 410', the test signal is immediately fed back to the input terminal of the input buffer 390 by the connection line 410' commonly connected therewith, and the input buffer 390 transfers the test signal to the programmable logic device 350.

At this time, the demultiplexer 354 of the programmable logic device 350 routes the test signal to the output buffer 320 but not to the output buffer 340, and continuously the test signal is transferred to the input buffer 120 of the pattern generation part 100 through the output buffer 320 of the programmable logic part 300 and the bidirectional bus line 200. Finally, the test signal is fed back to the pattern generator 102, and the pattern generator 102 measures the round-trip time using the test signal even without a DUT.

In this embodiment, the round-trip time of the test signal can be measured by the same way as described above.

That is, the pattern generator 102 outputs the test signal at a starting time (S100). And then, the pattern generator 102 checks an arrival time at which the test signal is fed back to the pattern generator 102 after traveling through the first output buffer 130, the second line of the bidirectional bus 200', the third input buffer 330, the programmable logic device 350, the fifth output buffer 380, the sixth connection line 410', the fifth input buffer 390, the programmable logic device 350, the fourth output buffer 320, the first line of the bidirectional bus 200 and the second input buffer 120, in order (S200).

Next, the pattern generator 102 measures the round-trip time of the test signal using a time difference between the starting time and the arrival time.

The apparatus for measuring the round-trip time of the test signal according to the embodiments of the present invention is spatially and economically favorable in that it can measure the round-trip time of the test signal for memory testing without additional devices or bus lines only for test purposed, even when the DUT is not connected in the apparatus.

Further, according the present invention, the round-trip time may be immediately measured even when the circuitry of the programmable logic device is modified, and based on the obtained round-trip time, temporal correction may be implemented in the pattern generator, thus achieving accurate testing.

Although the embodiments of the present invention have been disclosed for illustrative purposes, those skilled in the art will appreciate that a variety of different variations and modifications are possible, without departing from the scope and spirit of the invention as disclosed in the accompanying claims. Accordingly, such variations and modifications should also be understood as falling within the scope of the present invention.

What is claimed is:

1. An apparatus for measuring round-trip time of a test signal using a programmable logic device, comprising:
   a pattern generator generating a test signal and measuring a round-trip time of the test signal;
   first and second output buffers, each of which includes an input terminal connected to the pattern generator;
   first and second input buffers, each of which includes an output terminal connected to the pattern generator;
   a programmable logic device of which internal circuits are configured to transmit the test signal in a predetermined manner;
   third, fourth, fifth and sixth output buffers, each of which includes an input terminal connected to the programmable logic device;
   third, fourth, fifth and sixth input buffers, each of which includes an output terminal connected to the programmable logic device;
   a first connection line connecting an output terminal of the first output buffer and an input terminal of the first input buffer;
   a second connection line connecting an output terminal of the second output buffer and an input terminal of the second input buffer;
   a third connection line connecting an output terminal of the third output buffer and an input terminal of the third input buffer;
   a fourth connection line connecting an output terminal of the fourth output buffer and an input terminal of the fourth input buffer;
   a fifth connection line connecting an output terminal of the fifth output buffer and an input terminal of the fifth input buffer;
   a sixth connection line connecting an output terminal of the sixth output buffer and an input terminal of the sixth input buffer;
   a first line of a bidirectional bus connecting the first connection line with the third connection line; and
   a second line of the bidirectional bus connecting the second connection line with the fourth connection line;
   wherein the programmable logic device connects
      the output terminal of the third input buffer to the input terminal of the fifth output buffer, and
      the output terminal of the fifth input buffer to the input terminal of the fourth output buffer, and
   wherein a round-trip time of the test signal is measured by
      a time difference between a starting time at which the pattern generator outputs the test signal and an arrival time at which the test signal is fed back to the pattern generator after traveling through the first output buffer, the first line of the bidirectional bus, the third input buffer, the programmable logic device, the fifth output buffer, the fifth connection line, the fifth input buffer, the programmable logic device, the fourth output buffer, the second line of the bidirectional bus and the second input buffer, in order.

2. The device of claim 1, wherein a device under test (DUT) is configured to be connected to at least one of the fifth and the sixth connection lines.

3. The device of claim 2, wherein the DUT includes a plurality of memory devices to be tested.

4. The device of claim 1, wherein the programmable logic device includes a first demultiplexer configured to connect the output terminal of the fifth input buffer to the input terminal of the fourth output buffer or the input terminal of the third output buffer.

5. The device of claim 4, wherein the programmable logic device further includes a second demultiplexer configured to connect the output terminal of the sixth input buffer to the input terminal of the fourth output buffer or the input terminal of the third output buffer.

6. A method for measuring round-trip time of a test signal using an apparatus including:
a pattern generator generating a test signal and measuring a round-trip time of the test signal;
first and second output buffers, each of which includes an input terminal is connected to the pattern generator;
first and second input buffers, each of which includes an output terminal is connected to the pattern generator;
a programmable logic device of which internal circuits are configured to transmit the test signal in a predetermined manner;
third, fourth and fifth output buffers, each of which includes an input terminal connected to the programmable logic device;
third, fourth and fifth input buffers, each of which includes an output terminal connected to the programmable logic device;
a first connection line connecting an output terminal of the first output buffer and an input terminal of the first input buffer;
a second connection line connecting an output terminal of the second output buffer and an input terminal of the second input buffer;
a third connection line connecting an output terminal of the third output buffer and an input terminal of the third input buffer;
a fourth connection line connecting an output terminal of the fourth output buffer and an input terminal of the fourth input buffer;
a fifth connection line connecting an output terminal of the fifth output buffer and an input terminal of the fifth input buffer;
a sixth connection line connecting an output terminal of the sixth output buffer and an input terminal of the sixth input buffer;
a first line of a bidirectional bus connecting the first connection line with the third connection line; and
a second line of the bidirectional bus connecting the second connection line with the fourth connection line;
wherein the programmable logic device connects
the output terminal of the third input buffer to the input terminal of the fifth output buffer, and
the output terminal of the fifth input buffer to the input terminal of the fourth output buffer,
the method comprising:
outputting, by the pattern generator, the test signal at a starting time;
checking, by the pattern generator, an arrival time at which the test signal is fed back to the pattern generator after traveling through the first output buffer, the first line of the bidirectional bus, the third input buffer, the programmable logic device, the fifth output buffer, the fifth connection line, the fifth input buffer, the programmable logic device, the fourth output buffer, the second line of the bidirectional bus and the second input buffer, in order; and
measuring, by the pattern generator, a round-trip time of the test signal using a time difference between the starting time and the arrival time.

* * * * *